(12) United States Patent
Dattaguru et al.

(10) Patent No.: US 7,675,160 B2
(45) Date of Patent: Mar. 9, 2010

(54) INDIVIDUAL SUB-ASSEMBLY CONTAINING A CERAMIC INTERPOSER, SILICON VOLTAGE REGULATOR, AND ARRAY CAPACITOR

(75) Inventors: Sriram Dattaguru, Chandler, AZ (US); Larry Binder, Clinton, MA (US); Cengiz A. Palanduz, Chandler, AZ (US); Chris Jones, Chandler, AZ (US); Dave Bach, Shewabury, MA (US); Kaladhar Radhakrishnan, Gilbert, AZ (US); Timothe Litt, Southborough, MA (US)

(73) Assignee: Intel Corporation, Santa Clara, CA (US)

( * ) Notice: Subject to any disclaimer, the term of this patent is extended or adjusted under 35 U.S.C. 154(b) by 519 days.

(21) Appl. No.: 11/648,301

(22) Filed: Dec. 29, 2006

(65) Prior Publication Data

US 2008/0157274 A1  Jul. 3, 2008

(51) Int. Cl.
*H01L 23/48* (2006.01)
(52) U.S. Cl. .............. 257/698; 257/532; 257/701; 257/724; 257/723; 257/E33.058
(58) Field of Classification Search ........... 257/698, 257/532, 701, 724, 723, E33.058
See application file for complete search history.

(56) References Cited

U.S. PATENT DOCUMENTS

| | | | |
|---|---|---|---|
| 6,396,137 B1 * | 5/2002 | Klughart | 257/691 |
| 6,424,034 B1 * | 7/2002 | Ahn et al. | 257/723 |
| 6,489,686 B2 * | 12/2002 | Farooq et al. | 257/777 |
| 6,888,235 B2 * | 5/2005 | Lopata et al. | 257/691 |
| 2004/0026715 A1 * | 2/2004 | Rabadam et al. | 257/202 |
| 2004/0045161 A1 * | 3/2004 | Larson | 29/832 |
| 2005/0035436 A1 * | 2/2005 | Novak et al. | 257/678 |
| 2005/0141206 A1 * | 6/2005 | Radhakrishnan et al. | 361/782 |
| 2005/0280137 A1 * | 12/2005 | Cornelius | 257/691 |
| 2005/0285243 A1 * | 12/2005 | Stone et al. | 257/678 |
| 2005/0285252 A1 * | 12/2005 | Nair | 257/690 |
| 2008/0142961 A1 * | 6/2008 | Jones et al. | 257/724 |

\* cited by examiner

*Primary Examiner*—Eugene Lee
(74) *Attorney, Agent, or Firm*—David L. Guglielmi

(57) ABSTRACT

In some embodiments, an individual sub-assembly containing a ceramic interposer, silicon voltage regulator, and array capacitor is presented. In this regard, an apparatus is introduced having a table-shaped ceramic interposer containing conductive traces, a silicon voltage regulator coupled with contacts on a first surface of the ceramic interposer, and an array capacitor coupled with contacts on a second surface of the ceramic interposer. Other embodiments are also disclosed and claimed.

7 Claims, 2 Drawing Sheets

INDIVIDUAL SUB-ASSEMBLY CONTAINING A CERAMIC INTERPOSER, SILICON VOLTAGE REGULATOR, AND ARRAY CAPACITOR

FIELD OF THE INVENTION

Embodiments of the present invention generally relate to the field of integrated circuit packages, and, more particularly to an individual sub-assembly containing a ceramic interposer, silicon voltage regulator, and array capacitor.

BACKGROUND OF THE INVENTION

Silicon voltage regulators are being incorporated into integrated circuit (IC) packages as a way to improve power delivery to the IC device(s). However, the testing and assembly of conventional IC packages are burdensome in that the voltage regulator is typically attached to a sub-assembly for electrical testing and then reworked to be removed from the sub-assembly and attached to the IC package substrate.

BRIEF DESCRIPTION OF THE DRAWINGS

The present invention is illustrated by way of example and not limitation in the figures of the accompanying drawings in which like references indicate similar elements, and in which.

DETAILED DESCRIPTION

In the following description, for purposes of explanation, numerous specific details are set forth in order to provide a thorough understanding of the invention. It will be apparent, however, to one skilled in the art that embodiments of the invention can be practiced without these specific details. In other instances, structures and devices are shown in block diagram form in order to avoid obscuring the invention.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

Figure 1:
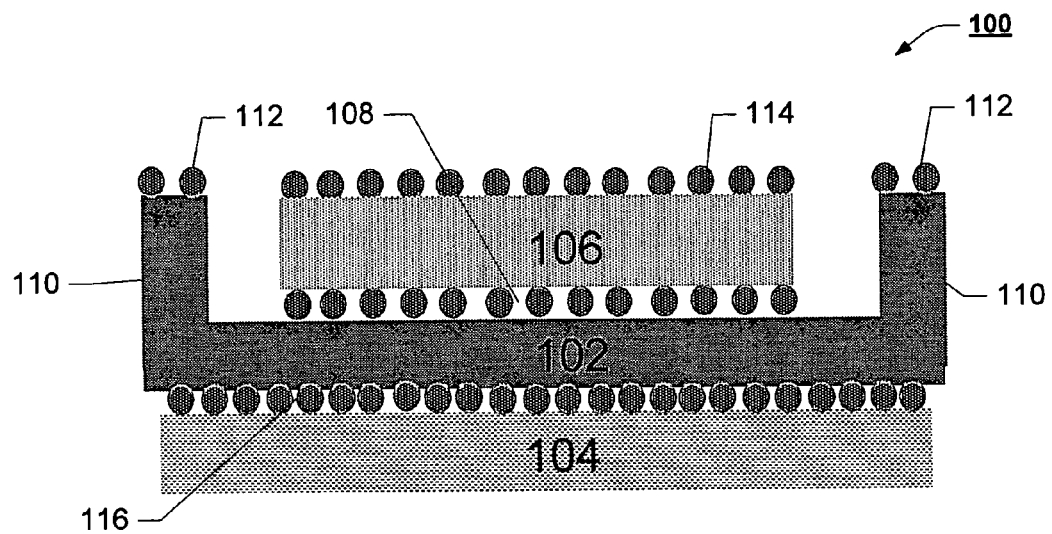
FIG. 1 is a graphical illustration of a cross-sectional view of an individual sub-assembly containing a ceramic interposer, silicon voltage regulator, and array capacitor, in accordance with one example embodiment of the invention.

FIG. 1 is a graphical illustration of a cross-sectional view of an individual sub-assembly containing a ceramic interposer, silicon voltage regulator, and array capacitor, in accordance with one example embodiment of the invention. In accordance with the illustrated example embodiment, sub-assembly 100 includes one or more of ceramic interposer 102, silicon voltage regulator 104, array capacitor 106, interposer bottom surface 108, interposer leg 110, leg contacts 112, array capacitor contacts 114, and interposer top surface 116.

Ceramic interposer 102 represents a table shaped interposer containing conductive traces. In one embodiment, ceramic interposer 102 electrically couples silicon voltage regulator 104, a small pitch device on interposer top surface 116, with array capacitor 106, a larger pitch device on interposer bottom surface 108.

Silicon voltage regulator 104 represents an integrated circuit that converts an input voltage to one or more output voltages. Silicon voltage regulator 104 can be controlled and adjusted by input signals. In one embodiment, there are a plurality of voltage input and output contacts on silicon voltage regulator 104 to provide adequate current. In one embodiment, there are a plurality of voltage input and output contacts on silicon voltage regulator 104 to deliver power in multiple phases.

Array capacitor 106 represents a tile containing many layers of conductive plates to store charge. One skilled in the art would appreciate that array capacitor 106 may be useful to decouple power to and from silicon voltage regulator 104.

Interposer 102 may have one or more legs 110 to provide mechanical support and trace routing. In one embodiment, control signals to silicon voltage regulator 104 are routed through leg(s) 110. Leg contacts 112 and array capacitor contacts 114 are substantially flush to each other and allow sub-assembly 100 to be coupled with a test socket for electrical testing and/or burn-in testing before being attached to a ceramic substrate of an IC package.

Figure 2:
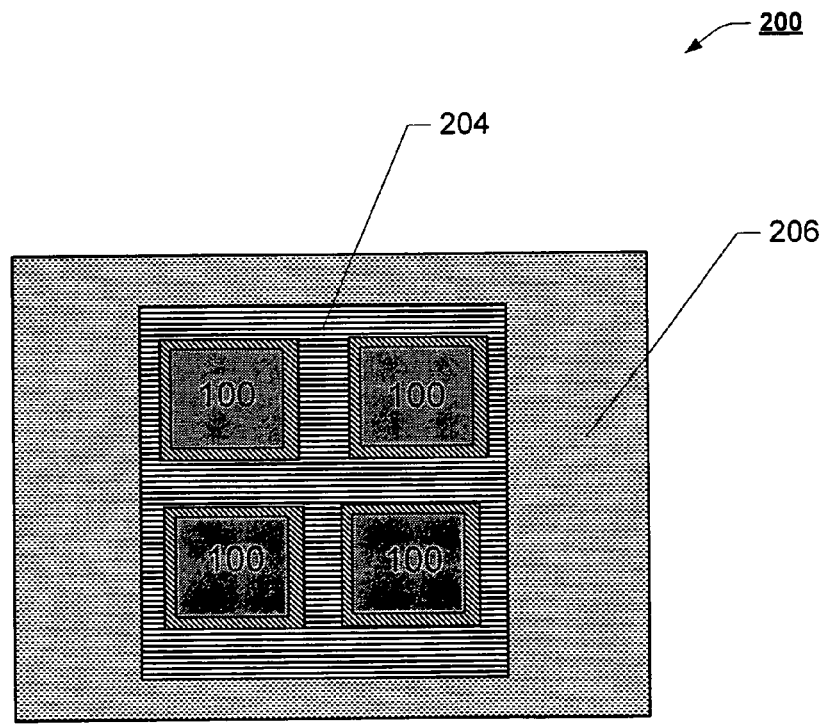
FIG. 2 is a graphical illustration of a bottom view of an IC package including multiple individual sub-assemblies, in accordance with one example embodiment of the invention.

FIG. 2 is a graphical illustration of a bottom view of an IC package including multiple individual sub-assemblies, in accordance with one example embodiment of the invention. As shown, IC package 200 includes one or more of sub-assemblies 100, ceramic substrate 204 and land grid array (LGA) region 206. While shown as including four sub-assemblies 100, IC package 200 may include any number of sub-assemblies 100. In one embodiment, each sub-assembly 100 has passed quality testing prior to being attached to ceramic substrate 204. While LGA region 206 comprises lands for coupling with pins in a socket, in other embodiments other interconnects may be utilized.

Figure 3:
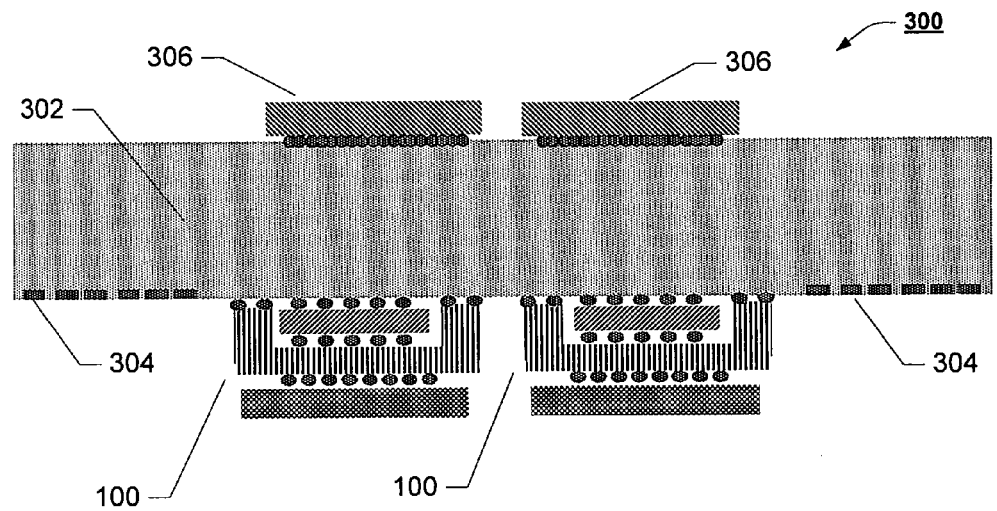
FIG. 3 is a graphical illustration of a cross-sectional view of an IC package including multiple individual sub-assemblies, in accordance with one example embodiment of the invention.

FIG. 3 is a graphical illustration of a cross-sectional view of an IC package including multiple individual sub-assemblies, in accordance with one example embodiment of the invention. As shown, IC package 300 includes one or more of sub-assemblies 100, ceramic substrate 302, package connections 304, and IC dice 306. While shown with two sub-assemblies 100 and two IC dice 306, IC package 300 may include any number of sub-assemblies and dice.

Ceramic substrate 302 represents dielectric material containing electrical traces, not shown, for power and data transmission to and from IC dice 306.

Package connections 304 provide an interface between IC package 300 and other components, for example through a socket. In one embodiment, control signals for silicon voltage regulators of sub-assemblies 100 are routed through package connections 304 to leg contacts 112 while power and ground are routed through package connections 304 to array capacitor contacts 114.

IC Dice 306 may represent any type of integrated circuit device or devices that would benefit from having voltage regulation at the package substrate, for example multi-core processors.

Figure 4:
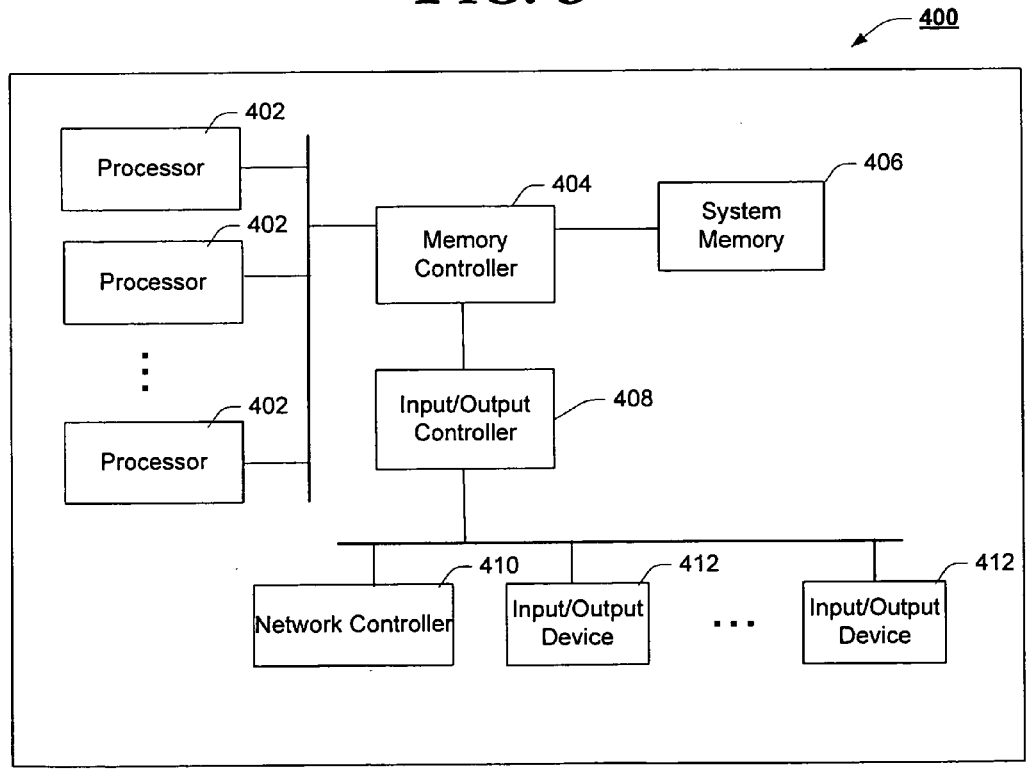
FIG. 4 is a block diagram of an example electronic appliance suitable for implementing an IC package including an individual sub-assembly, in accordance with one example embodiment of the invention.

FIG. 4 is a block diagram of an example electronic appliance suitable for implementing an IC package including an individual sub-assembly, in accordance with one example embodiment of the invention. Electronic appliance 400 is intended to represent any of a wide variety of traditional and non-traditional electronic appliances, laptops, desktops, cell phones, wireless communication subscriber units, wireless communication telephony infrastructure elements, personal digital assistants, set-top boxes, or any electric appliance that would benefit from the teachings of the present invention. In accordance with the illustrated example embodiment, electronic appliance 400 may include one or more of processor(s) 402, memory controller 404, system memory 406, input/output controller 408, network controller 410, and input/output device(s) 412 coupled as shown in FIG. 4. Processor(s) 402, or other integrated circuit components of electronic appliance 400, may be housed in a package including a substrate with an individual sub-assembly containing a ceramic interposer, silicon voltage regulator, and array capacitor described previously as an embodiment of the present invention.

Processor(s) 402 may represent any of a wide variety of control logic including, but not limited to one or more of a microprocessor, a programmable logic device (PLD), programmable logic array (PLA), application specific integrated circuit (ASIC), a microcontroller, and the like, although the present invention is not limited in this respect. In one embodiment, processors(s) 402 are Intel® processors. Processor(s) 402 may have an instruction set containing a plurality of machine level instructions that may be invoked, for example by an application or operating system.

Memory controller 404 may represent any type of chipset or control logic that interfaces system memory 406 with the other components of electronic appliance 400. In one embodiment, the connection between processor(s) 402 and memory controller 404 may be referred to as a front-side bus. In another embodiment, memory controller 404 may be referred to as a north bridge.

System memory 406 may represent any type of memory device(s) used to store data and instructions that may have been or will be used by processor(s) 402. Typically, though the invention is not limited in this respect, system memory 406 will consist of dynamic random access memory (DRAM). In one embodiment, system memory 406 may consist of Rambus DRAM (RDRAM). In another embodiment, system memory 406 may consist of double data rate synchronous DRAM (DDRSDRAM).

Input/output (I/O) controller 408 may represent any type of chipset or control logic that interfaces I/O device(s) 412 with the other components of electronic appliance 400. In one embodiment, I/O controller 408 may be referred to as a south bridge. In another embodiment, I/O controller 408 may comply with the Peripheral Component Interconnect (PCI) Express™ Base Specification, Revision 1.0a, PCI Special Interest Group, released Apr. 15, 2003.

Network controller 410 may represent any type of device that allows electronic appliance 400 to communicate with other electronic appliances or devices. In one embodiment, network controller 410 may comply with a The Institute of Electrical and Electronics Engineers, Inc. (IEEE) 802.11b standard (approved Sep. 16, 1999, supplement to ANSI/IEEE Std 802.11, 1999 Edition). In another embodiment, network controller 410 may be an Ethernet network interface card.

Input/output (I/O) device(s) 412 may represent any type of device, peripheral or component that provides input to or processes output from electronic appliance 400.

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form.

Many of the methods are described in their most basic form but operations can be added to or deleted from any of the methods and information can be added or subtracted from any of the described messages without departing from the basic scope of the present invention. Any number of variations of the inventive concept is anticipated within the scope and spirit of the present invention. In this regard, the particular illustrated example embodiments are not provided to limit the invention but merely to illustrate it. Thus, the scope of the present invention is not to be determined by the specific examples provided above but only by the plain language of the following claims.

What is claimed is:

1. An electronic appliance comprising:
    a network controller;
    a system memory; and
    a processor, wherein the processor includes a ceramic substrate coupled with a sub-assembly, the sub-assembly containing a table-shaped ceramic interposer, a silicon voltage regulator coupled with a first surface of the interposer and an array capacitor coupled with a second surface of the interposer.

2. The electronic appliance of claim 1 wherein the ceramic substrate couples with contacts on the array capacitor and contacts on a leg of the ceramic interposer.

3. The electronic appliance of claim 2 further comprising conductive traces in the ceramic interposer to route control signals to the silicon voltage regulator through the contacts on the leg of the ceramic interposer.

4. The electronic appliance of claim 2 further comprising conductive traces in the ceramic interposer to route power to the silicon voltage regulator through the array capacitor.

5. The electronic appliance of claim 4 wherein the power is capable of being delivered in multiple phases.

6. The electronic appliance of claim 1 further comprising a plurality of integrated circuit dice coupled with the ceramic substrate.

7. The electronic appliance of claim 1 further comprising a second substantially same sub-assembly coupled with the ceramic substrate.

* * * * *